United States Patent [19]

Liang et al.

[11] Patent Number: 4,977,060

[45] Date of Patent: Dec. 11, 1990

[54] METHOD FOR PRODUCING MICROCAPSULES AND PHOTOSENSITIVE MICROCAPSULES PRODUCED THEREBY

[75] Inventors: Rong-Chang Liang, Centerville; Jesse Hipps, Sr., Dayton; Jing-Den Chen, Spring Valley, all of Ohio

[73] Assignee: The Mead Corporation, Dayton, Ohio

[21] Appl. No.: 447,283

[22] Filed: Dec. 7, 1989

[51] Int. Cl.$^5$ .............................................. G03C 1/72
[52] U.S. Cl. .................................... 430/138; 264/4.7; 428/402.21; 503/214
[58] Field of Search ........................ 430/138; 264/4.7; 428/402.21; 503/214

[56] References Cited

U.S. PATENT DOCUMENTS

| | | | |
|---|---|---|---|
| 3,396,209 | 8/1968 | Ragas et al. | 260/856 |
| 3,403,088 | 9/1968 | Hart | 204/181 |
| 3,450,660 | 6/1969 | Sekmakas | 260/29.4 |
| 4,444,699 | 4/1984 | Hayford | 264/4.7 |
| 4,490,313 | 12/1984 | Brown et al. | 264/4.7 |
| 4,552,811 | 11/1985 | Brown et al. | 428/402.21 |
| 4,675,249 | 6/1987 | Bowman | 428/402.21 |
| 4,761,358 | 8/1988 | Hosoi et al. | 430/138 |
| 4,820,610 | 4/1989 | Nakamura et al. | 430/138 |
| 4,883,737 | 11/1989 | Yamamoto | 430/138 |
| 4,889,786 | 12/1989 | Takahashi | 430/138 |

OTHER PUBLICATIONS

Sperling, L. H., "Interpenetrating Polymer Networks & Related Material", pp. 2-3, Plenum Press, N.Y., 1981.
Gould, R. P. ed. 161st Symposium on Electrodeposition of Coatings, Advances in Chemistry Series, pp. 216-266, Wash., D.C. 1975.

*Primary Examiner*—Hoa Van Le
*Attorney, Agent, or Firm*—Thompson, Hine and Flory

[57] ABSTRACT

A process for producing microcapsules comprising the steps of: adding a hydroxy or amine functionalized acrylic resin or copolymer to an aqueous emulsion including a dispersed internal phase composition;
simultaneously or subsequently adding a formaldehyde condensate prepolymer to said emulsion; and
forming interpenetrating polymer network microcapsule walls around said internal phase, said interpenetrating polymer network microcapsule walls comprising the condensation reaction product of said functionalized acrylic resin or copolymer and said formaldehyde condensate prepolymer is disclosed.

15 Claims, No Drawings

METHOD FOR PRODUCING MICROCAPSULES AND PHOTOSENSITIVE MICROCAPSULES PRODUCED THEREBY

BACKGROUND OF THE INVENTION

1. Field of the Invention

The present invention relates to an improved method for producing microcapsules and, more particularly, to an improved method for producing microcapsules having one or more microcapsule walls, wherein at least one of the microcapsule walls is an interpenetrating polymer network formed from the condensation reaction between a functionalized acrylic copolymer and an amine formaldehyde or phenol formaldehyde prepolymer. While the method of the present invention is useful in producing microcapsules generally, microcapsules prepared in accordance with the present invention are particularly useful in carbonless pressure-sensitive recording systems and in photographic photosensitive imaging materials of the type which employ a layer of microcapsules containing a radiation sensitive composition.

2. Description of the Prior Art

Imaging materials employing photosensitive microcapsules are the subject of commonly assigned U.S. Pat. Nos. 4,399,209 and 4,440,846.

In the aforesaid commonly assigned U.S. Patents, images are formed by image-wise exposing a layer of photosensitive capsules to actinic radiation and rupturing the capsules typically by passing the imaging sheet containing the capsules through a pressure nip. The radiation sensitive composition contains a photohardenable or photosoftenable material which undergoes a change in viscosity upon exposure. For example, in the most typical embodiments, the radiation sensitive composition contains a polyethylenically unsaturated monomer which polymerizes upon exposure, thereby causing the internal phase of the capsules to harden. Due to the difference in the hardness of the capsules in the exposed versus the unexposed areas, only certain capsules rupture and release their contents. If the internal phase contains a dye precursor, the precursor is image-wise released, and a color image is formed upon its transfer to a developer layer. In previously disclosed embodiments, the developer layer may be present on the same support as the layer of capsules or a separate support. It is advantageous if the developer is present on the same support since such a self-contained imaging sheet can be developed as an integral unit.

Microcapsules formulated under the prior art exhibit high sensitivity to moisture and/or humidity. The microcapsule walls tend to absorb moisture and swell.

These swollen microcapsules also contain additional oxygen or are more permeable to oxygen, which is not otherwise present in significant amounts in non-swollen microcapsules. Where the internal phase of the microcapsule contains a photohardenable composition, photohardening is achieved by polymerizing a monomer which is present in the internal phase of the microcapsules, typically by free radical additional polymerization. Where oxygen is present, the oxygen can act as a free radical scavenger, and prevent the radicals from polymerizing the monomer.

Some amount of oxygen is present in all polymeric microcapsules. Thus a finite threshold amount of radiation must be applied to the microcapsules such that the photoinitiator generates a sufficient amount of radicals to deplete the oxygen present. When this threshold level is reached, the radicals generated by the photoinitiator will cause the monomer to polymerize. Oxygen is typically present in concentrations of approximately $10^{-3}$ to $10^{-4}$ moles per liter of internal phase of the microcapsules. This amount must be nearly completely depleted to induce polymerization.

The threshold quantum of radiation necessary to deplete the oxygen present is commonly referred to as the "induction energy" while the light intensity used for exposure is referred to as "induction intensity". The time for which this energy must be applied is referred to as the "induction time".

Induction time varies with the light intensity such that when a higher intensity is applied, a shorter time period is needed to deplete oxygen present and initiate free radical polymerization of the monomer. The reverse is also true. A log-log plot of induction intensity versus induction time yields a reciprocity curve for which, under ideal conditions, the resulting curve is a straight line having a slope of $-1$.

It has been found that where microcapsules swell due to the presence of moisture, the reciprocity curve suffers severe deviations, particularly in the areas involving lower induction intensities (and correspondingly longer induction times). This deviation is theorized to be caused by the diffusion of oxygen from outside of the capsule walls into the internal phase. Failure is particularly accentuated where the microcapsules are exposed in a relatively high humidity environment, as high humidity significantly deteriorates the barrier properties of the capsule walls.

The result is that under high moisture or humidity conditions using a set induction intensity and time (usually dictated by imaging hardware design parameters), swollen microcapsules fail to polymerize in an image-wise pattern, resulting in inferior reproductions.

Thus, there has arisen a need in the art for a microcapsule having a wall which is less sensitive to humidity.

SUMMARY OF THE INVENTION

In accordance with the present invention microcapsules are prepared which are resistant to swelling under higher humidity conditions the microcapsules have one or more microcapsule walls, at least one of which comprises an interpenetrating polymer network [IPN].

The IPN is produced by reacting a hydroxy or amine functionalized acrylic resin or copolymer with a formaldehyde condensate prepolymer such as melamine formaldehyde or phenol formaldehyde prepolymer in a condensation reaction to build a hydrophobic microcapsule wall. The IPN functions to prevent degradation of the photosensitive material by resisting the tendency for swelling in a high humidity environment.

More specifically, the method for forming the microcapsules comprises the steps of:
  adding a hydroxy or amine functionalized acrylic resin or copolymer to an aqueous emulsion including a dispersed internal phase composition;
  simultaneously or sequentially adding a formaldehyde condensate prepolymer to said emulsion; and
  forming interpenetrating polymer network microcapsule walls around said internal phase, said interpenetrating polymer network microcapsule walls comprising the condensation reaction product of said functionalized acrylic resin or copolymer and said formaldehyde condensate prepolymer.

In one embodiment of the present invention microcapsules are prepared by formulating a first inner microcapsule wall containing an internal phase by means known in the art, and overcoating the first inner wall with a secondary microcapsule wall comprising the above defined IPN.

In a preferred embodiment of the present invention, the first inner wall is an isocyanate-derived wall and is produced by utilizing a polyisocyanate present in the internal phase which undergoes interfacial polycondensation with one or more reactive groups present in the continuous phase of the emulsion.

Also disclosed in the present invention is a photosensitive imaging material which exhibits improved resistance to high moisture or humidity conditions in which images are formed by image-wise reaction of one or more chromogenic materials and a developer, said material being produced by:
  adding a hydroxy or amine functionalized acrylic resin or copolymer to an aqueous emulsion including a dispersed internal phase composition comprising a material which undergoes a change in viscosity upon exposure to actinic radiation and an image-forming agent;
  simultaneously or sequentially adding a formaldehyde condensate prepolymer to said emulsion; and
  forming an interpenetrating polymer network microcapsule walls around said internal phase, said interpenetrating polymer network microcapsule walls comprising the condensation reaction product of said functionalized acrylic resin or copolymer and said formaldehyde condensate prepolymer.

Photosensitive microcapsules obtained in accordance with the present invention may be further characterized by an average particle size in the range of about 4 to 8 microns. At least 90% of the microcapsules have a particle size less than 10 microns. In accordance with one particular embodiment of the invention microcapsules having an average particle size of 5 microns and a size distribution of 2 to 10 microns are obtained.

Because of their uniform small size these microcapsules are particularly useful in carbonless pressure-sensitive imaging systems and in photosensitive imaging systems.

In the former embodiment, the core material is typically a substantially colorless color former dissolved in an oil. In the latter embodiment, the core material is typically a photosensitive composition containing a color former.

Pressure-sensitive recording paper is well known in the art. It is described in U.S. Pat. Nos. 2,550,446; 2,712,507; 2,703,456; 3,016,308; 3,170,809; 3,455,721; 3,466,184; 3,672,935; 3,955,025; and 3,981,523.

Photosensitive imaging systems employing microencapsulated radiation sensitive compositions are the subject of commonly assigned U.S. Pat. Nos. 4,399,209; 4,416,966 and 4,440,846.

The photosensitive imaging system microcapsules may contain a photohardenable or a photosoftenable material as the radiation sensitive material. In the most typical case, the capsules contain a polyethylenically unsaturated monomer, a photoinitiator, and a dye precursor. Imaging is conducted as described in the aforementioned commonly assigned patents which are incorporated herein by reference.

DETAILED DESCRIPTION OF THE INVENTION

U.S. Pat. Nos. 4,399,209; 4,772,530 and 4,772,541, which are incorporated by reference, teach the use of color precursors, color developer materials, printing or coating techniques, substrates, diluent oils and the use of imaging sheets.

In accordance with the present invention, microcapsules which resist swelling in a high humidity environment are prepared by enwrapping an internal phase with one or more microcapsule walls, at least one of said walls comprising an IPN formulated from the condensation reaction of a functionalized acrylic resin or copolymer and a formaldehyde condensate prepolymer.

The method for forming the hydrophobic microcapsule wall to form the IPN involves the reaction of hydroxy or amine functionalized acrylic resins with a formaldehyde condensation prepolymer. The term "IPN" is used herein as it is used in the art, namely, to refer to the network which results when two polymers are synthesized or crosslinked in the presence of each other.

Suitable functionalized acrylic copolymers which can be reacted with a formaldehyde condensate prepolymer to form an IPN include hydroxy functionalized acrylic copolymers of formula (I) and amine functionalized copolymers of formula (II).

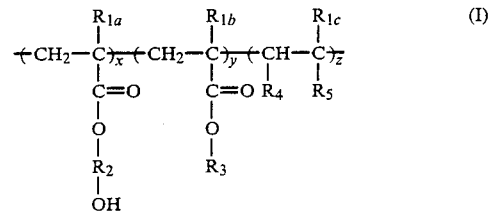
(I)

$R_{1a}$ = H, —CH$_3$ or $R_2$—COOH;
$R_{1b}$ = H, —CH$_3$ or $R_2$—COOH;
$R_{1c}$ = H, —CH$_3$ or $R_2$—COOH;
$R_2$ = alkylene;
$R_3$ = alkyl, aryl, alkaryl or hydrogen;
$R_4$ = H or —COOH;
$R_5$ = aryl, —CN,

alkaryl, —SO$_3$Na or

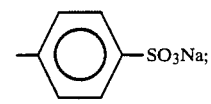

x is between 0.01 and 0.4, preferably between 0.05 and 0.2;
The sum of y and z is between 0.6 and 0.95;
the sum of x, y and z is 1.

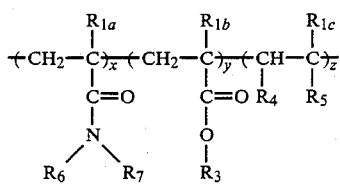

$R_{1a}$, $R_{1b}$, $R_{1c}$, $R_3$, $R_4$, $R_5$, x, y and z are as defined above in Formula (I);
$R_6$ = H, —$CH_2OH$ or —$CH_2OR_8$;
$R_7$ = H, —$CH_2OH$ or —$CH_2OR_8$; and $R_8$ is an alkyl group.

In formulas (I) and (II), x, y and z are adjusted so that the copolymer is soluble in water while maximizing hydrophobicity. In a particularly preferred embodiment $R_{1c}$, $R_4$ and $R_5$ are selected so that the comonomer is acrylonitrile. The presence of this monomer provides high barrier properties and solvent resistance. When this embodiment is utilized, z ranges from about 0.2 to about 0.4.

In alternate embodiments, $R_{1c}$, $R_4$ and $R_5$ may be selected to produce acrylic acid, methacrylic acid, itaconic acid, maleic anhydride, vinylbenzene sulfonate, vinylsulfonate, or 3-sulfopropyl(meth)acrylate monomers. These monomers increase water solubility of the copolymer. When these embodiments are selected, z ranges from about 0.001 to 0.1, and more preferably 0.01 to 0.06.

In practice, the molecular weight of the copolymers represented by formulas (I) and (II) ranges between 500 and 10,000, and more preferably between 1000 and 5000.

In practice, co-polymers of either formula (I) or formula (II) may be selected as a starting material for the IPN. However, it is also possible to use a copolymer of both formula (I) and formula (II).

Specific examples of functionalized prepolymers are listed below. Others skilled in the art will appreciate that the below listing is merely representative.

|  | Parts by Weight |
| --- | --- |
| Copolymer 1 | |
| Methyl methacrylate | 290 |
| Ethyl acrylate | 230 |
| Butyl methacrylate | 320 |
| 2-Hydroxypropyl acrylate | 100 |
| Methacrylic acid | 60 |
| Copolymer 2 | |
| Acrylonitrile | 750 |
| Ethyl acrylate | 575 |
| Butyl methacrylate | 400 |
| Methyl methacrylate | 375 |
| 2-Hydroxypropyl methacrylate | 250 |
| Methacrylic acid | 150 |
| Copolymer 3 | |
| Methyl methacrylate | 725 |
| Ethyl acrylate | 575 |
| Butyl methacrylate | 800 |
| 2-Hydroxypropyl methacrylate | 250 |
| Methacrylic acid | 150 |
| Copolymer 4 | |
| Ethyl acrylate | 125 |
| Methyl methacrylate | 150 |
| Acrylonitrile | 150 |
| 2-Hydroxypropyl methacrylate | 50 |
| Methacrylic acid | 25 |
| Tertiary-dodecyl mercaptan | 15 |
| Copolymer 5 | |
| Methyl methacrylate | 840 |
| 2-Hydroxypropyl methacrylate | 100 |
| Methacrylic acid | 6 |

Other copolymers useful in the present invention may be prepared by replacing all or part of the 2-hydroxypropyl methacylate in Copolymers 1–5 with methacrylamide, N-methylolacrylamide or another n-hydroxyalkylacrylamide.

The other copolymer utilized to form the IPN comprises a formaldehyde condensation prepolymer. Examples of such prepolymers include melamine formaldehyde, urea formaldehyde, thiourea formaldehyde, aniline formaldehyde, cresol formaldehyde and xylenol formaldehyde prepolymers. Melamine formaldehyde is a particularly preferred prepolymer.

When used as an imaging material the microcapsules internal phase is a radiation sensitive oily core material, for example a photohardenable polyethylenically unsaturated compound, a photoinitiator and dye precursor. As will be appreciated, a multiple wall microcapsule may be used to enwrap the internal phase.

In a preferred embodiment, a first inner microcapsule wall is formed around the radiation-sensitive core material. This wall is typically an isocyanate-derived wall material or an amine-formaldehyde condensation product wall material, and the first inner wall is overcoated with the IPN. In the case of an isocyanate-derived wall material, the internal phase includes a polyisocyanate which undergoes interfacial polycondensation polymerization with the functional groups present in the continuous phase of the emulsion.

Among many well known encapsulation techniques that can be used to form the first inner microcapsule wall from a formaldehyde condensation product in accordance with the present invention are: Kiritani et al., U.S. Pat. No. 3,796,669 for urea-resorcinol-formaldehyde capsules; and Forris et al., U.S. Pat. Nos. 4,001,140; 4,087,376 and 4,089,802 for melamine-formaldehyde capsules. The present invention can also be practiced using the aforesaid techniques by incorporating water soluble polymers such as pectin and sulfonated polystyrene as a protective colloid and viscosity modifier prior to emulsification of the oil in addition to including a polyisocyanate.

The most typical examples of useful water soluble polymers are commonly known as pectins. Since pectin is a naturally occurring product, its composition will vary with the season and the source from which it is derived. As a result of this variation, some pectins will provide better microcapsules than others. Methylated polygalacturonic acid (pectin) is generally added to the aqueous phase in an mount of about 1.0 to 8% based on the amount of water in the aqueous phase, with the preferred amount being 2 to 4%.

Typical examples of protective colloids are sulfonated polystyrenes useful in the present invention are Versa TL500 and Versa TL502B, products of National Starch Co. Useful sulfonated polystyrenes are generally characterized by a sulfonation degree of over 85% and preferably over 95%. The molecular weight of the sulfonated polystyrene is preferably greater than 100,000 and more preferably about 500,000 but other molecular weights can also be used. The sulfonated polystyrene is usually added to the aqueous phase in an amount of about 1 to 6% by weight. The quality of this product has also been found to vary with the method by which it is manufactured such that certain sulfonated polystyrenes are better than others.

The formation of an internal wall is described in detail in U.S. Pat. No. 4,353,809. The polyisocyanate, initially present in the internal phase, is believed to react with water at the interface of the core material and the aqueous medium and form a thin layer of polymer which further stabilizes the emulsion. Preferred polyisocyanates are SF-50, an aromatic trisocyanate manufactured by Union Carbide, Desmodur N-100, a biuret of hexamethylene diisocyanate and water available from Mobay Chemical Co., and Baymicron 2109. The isocyanate is typically added in an amount of about 0.005 to 6 parts per 100 parts of the core material and preferably 0.01 to 5 parts.

For a particularly humidity resistant microcapsule, an amine-formaldehyde may additionally comprise a wall material. In such an embodiment a tertiary wall system is utilized wherein the innermost wall is derived from an isocyanate reactant, an intermediate wall comprises the amine formaldehyde wall and the outer wall comprises the IPN. The intermediate wall may be of a negligible thickness when the IPN is formed by the simultaneous addition of the functionalized acrylic copolymer and the formaldehyde precondensate copolymer into the emulsion.

Emulsification is preferably conducted under conditions which afford an emulsion having an average particle size in the range of about 2.5 to 5.0 microns. The observed particle size of the emulsion is somewhat smaller than the particle size of the capsules produced. Typically, the emulsion is prepared by adding an oily material to be encapsulated to an aqueous phase containing methylated polygalacturonic acid and sulfonated polystyrene while stirring or otherwise agitating the aqueous phase to achieve the desired emulsion particle size. The aqueous phase may include amine-formaldehyde or other capsule wall forming materials in a manner well known in the art.

Where it is desired to enwrap the oily core material in an amine-formaldehyde condensation product, the capsules may be formed by in situ condensation of formaldehyde and an amine such as urea, melamine, dimethylolurea and the like, or a pre-condensate thereof. The condensation product may be modified by the co-condensation of a polyhydric phenol such as resorcinol if desired. Microcapsules which are thus formed from a formaldehyde condensation reaction can be prepared by forming an aqueous phase containing pectin and Versa TL, and adjusting the pH to suit the condensation reaction to be employed, followed by the addition of the oil phase. Generally, a pH of about 4.0 is useful in making ureaformaldehyde microcapsules whereas a pH of 6.0 is used in making melamine-formaldehyde capsules. To assist in dissolving the pectin, a small amount of sodium bicarbonate may be added to the pectin. This also acts as a neutralizing agent and as a buffer and increases ionic strength and thereby improves wall building characteristics. Upon dissolution carbon dioxide is generated and the bubbles help to break up the pectin.

Blending is continued until an average emulsion particle size of about 3.5 microns has been achieved whereupon solutions of the amine and formaldehyde or a solution of a precondensate thereof are/is added to the emulsion and the capsule walls gradually form.

As indicated immediately above, the process of the invention typically involves forming an agitating aqueous solution having the core material, optionally including a polyisocyanate dispersed therein, and, while maintaining the dispersion, adding a formaldehyde precondensate to form a first inner wall and/or a second optional intermediate wall. An IPN outer wall is formulated by adding the functionalized acrylic copolymer and the formaldehyde condensate prepolymer to the dispersion either simultaneously with the inner wall forming components or in a subsequent step after formation of the inner wall(s). On reaction, any condensate separates from the solution which wets and enwraps the capsule core material. After the walls have been solidified, the capsules may be separated from the medium and washed.

One method wherein the IPN wall is formulated simultaneously with the inner wall(s), in accordance with the present invention involves the following steps:
(i) Preparing an aqueous solution of an emulsion stabilizer such as pectin and sulfonated polystyrene and adjusting pH to pH≧6
(ii) Emulsifying the core material including polyisocyanates in the aqueous solution
(iii) Adding an amine and formaldehyde or an amine-formaldehyde precondensate to the system and simultaneously adding a functionalized acrylic copolymer and the formaldehyde condensate prepolymer
(iv) Adjusting pH to acidic conditions (pH≦6)
(v) Polymerizing the amine and formaldehyde or precondensate thereof and the functionalized acrylic copolymer and formaldehyde condensate prepolymer while stirring the system
(vi) Heating, and
(vii) Removing the excess formaldehyde by adding urea, sodium bisulfite and the like.

Another method, wherein the IPN wall is formulated subsequent to the formation of the inner microcapsule wall(s), involves the following steps:
(i) Preparing an aqueous solution of an emulsion stabilizer such as pectin and sulfonated polystyrene and adjusting the pH to pH≧6
(ii) Emulsifying the core material, including polyisocyanates, in the aqueous solution
(iii) Adding an amine and formaldehyde or amineformaldehyde precondensate to the system
(iv) Adjusting pH to acidic conditions (pH≦6)
(v) Polymerizing the amine and formaldehyde or precondensate while stirring the system
(vi) Adding the functionalized acrylic copolymer and formaldehyde condensate prepolymer
(vii) Polymerizing the functionalized acrylic copolymer and formaldehyde condensate prepolymer
(viii) Heating, and
(ix) Removing the excess formaldehyde.

The condensation reaction proceeds under acid conditions, e.g., pH of 7 or less; however, the reaction is preferably carried out at a pH in the range of 2.5 to 6.0. The temperature of the encapsulation medium should be maintained at about 10° to 95° C., preferably about 25° to 85° C. and more preferably about 45° to 75° C.

Among the acid catalysts to promote the condensation reaction of the functionalized acrylic copolymer and the formaldehyde condensate prepolymer are low molecular weight carboxylic acids, e.g., formic acid, oxalic acid, etc.,; inorganic acids, e.g., sulfuric acid, hydrochloric acid, phosphoric acid, etc.; and acidic or easily hydrolyzable salts such as aluminum sulfate, ammonium nitrate, ammonium chloride, ammonium sulfate, etc. Ammonium salts are preferred as they provide a stronger and less permeable capsule. The ammonium salts are usually employed in an amount of about 2 to 20% by weight based on the amount of urea.

The functionalized acrylic copolymer and formaldehyde condensate prepolymer are preferably present in the encapsulation medium in a molar functional group ratio of at least 0.1 to 10 and preferably about 0.5 to 2.0.

To reduce malodor and the incidence of skin irritation, when the polymerization reaction is complete, it is desirable to remove or react any excess formaldehyde. This can be accomplished by using any one of several known techniques such as the addition of phosphoric acid, urea, sulfite or bisulfite. These materials react with the formaldehyde to form a product which is easily removed from the medium. The addition of the urea or sodium bisulfite to scavenge formaldehyde is preferably made in a single step after encapsulation and prior to storage. The pH and temperature of the medium should be adjusted for this reaction. The bisulfite is preferably reacted at a pH of 6 to 8 at room temperature for about 2 hours. The urea can be reacted at a pH of 3 to 5 or 8 to 12 at a temperature of 30 to 80° C. for 0.5 to 4 hours.

The radiation-sensitive compositions used as the internal phase in the present invention undergo a change in viscosity upon exposure to actinic radiation. "Actinic radiation" includes the entire electromagnetic spectrum e.g., U.V., I.R., visible, x-ray and ion beam radiation. These compositions may be positive working or negative working. For example, where the radiation sensitive composition contains a photohardenable material, such as a photopolymerizable or photocrosslinkable material, in the exposed areas the internal phase solidifies or increases in viscosity and thereby prevents the capsules from rupturing and releasing the image forming agent (e.g., a color precursor) associated with the capsules. In the unexposed areas, the internal phase remains liquid, the capsules rupture, and the image-forming agents are mobilized. In this manner positive images are formed. On the other hand, where the capsules contain a photosoftenable material, such as a photodepolymerizable material, exposure reduces the viscosity of the internal phase and the elements active in the image-forming process are released in the exposed areas whereby negative images are formed.

Typical positive-working radiation sensitive compositions include a photoinitiator and a monomer, dimer, or oligomer which is polymerized to a higher molecular weight compound, or a polymer which is cross-linked upon exposure. Ethylenically unsaturated organic compounds are particularly useful. These compounds contain at least one terminal ethylene group per molecule. Typically, they are liquid and can act as a diluent oil for the internal phase. Ethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA). Other examples of ethylenically unsaturated compounds are disclosed U.S. Pat. No. 4,772,541, which is hereby incorporated by reference.

Examples of negative working radiation depolymerizable materials that may be useful in the invention are polyphthaldehydes, polyacetals, poly(alkylene sulfones), hindered polycarbonates and hindered polyesters.

The radiation sensitive composition must make up a large enough proportion of the internal phase to effectively control the release of the image-forming agent following exposure. This generally means that the radiation sensitive material must constitute approximately 40 to 99% by weight of the internal phase of the capsules.

In the most typical case, images are formed by imagewise releasing an imaging-forming agent from the capsules after exposure. This typically involves coating the produced microcapsules onto an imaging substrate and image-wise exposing the substrate to actinic radiation to selectively harden or soften the microcapsules in response to the incident radiation. In this case, in addition to the radiation sensitive composition, the internal phase usually includes a color precursor or dye. Typical examples of color precursors useful in the present invention in providing photosensitive or pressure-sensitive systems include colorless electron donating type compounds. Representative examples of such colorformers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone and commercially available cyan, magenta and yellow color formers are often used alone or in combination as color precursors in the present invention. When a colorless color precursor is utilized, the microcapsules are typically pressure ruptured in the presence of a developer material which reacts with the color precursor to form a visible image. Examples of suitable developer materials include phenolic resins.

Having described the invention in detail and by reference to specific embodiments thereof, it will be apparent that numerous modifications and variations are possible without departing from the scope of the invention defined by the following claims.

What is claimed is:

1. A process for producing microcapsules comprising the steps of:
   adding a water soluble hydroxy or amine functionalized acrylic resin or copolymer to an aqueous emulsion including a dispersed internal phase composition;
   simultaneously or subsequently adding a formaldehyde condensate prepolymer to said emulsion; and
   forming interpenetrating polymer network microcapsule walls around said internal phase, said interpenetrating polymer network microcapsule walls comprising the condensation reaction product of said functionalized acrylic resin or copolymer and said formaldehyde condensate prepolymer.

2. The process according to claim 1 comprising the additional step of forming a secondary isocyanate derived wall around said internal phase by adding an isocyanate material to said internal phase, said addition occurring prior to said forming said interpenetrating polymer network microcapsule walls.

3. The process according to claim 2 comprising the additional step of forming a tertiary amine formaldehyde wall around said isocyanate derived wall, said forming occurring prior to or simultaneous to said forming said interpenetrating polymer network microcapsule walls.

4. The process according to claim 1 wherein said functionalized acrylic resin or copolymer is of Formula (I)

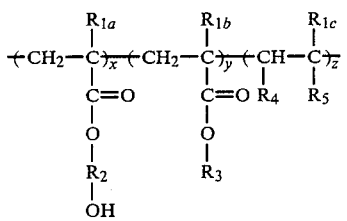

$R_{1a}$=H, —$CH_3$ or $R_2$—COOH;
$R_{1b}$=H, —$CH_3$ or $R_2$—COOH;
$R_{1c}$=H, —$CH_3$ or $R_2$—COOH;
$R_2$=alkylene;
$R_3$=alkyl, aryl, alkaryl or hydrogen;
$R_4$=H or —COOH;
$R_5$=aryl, —CN,

alkaryl, —$SO_3N_a$ or

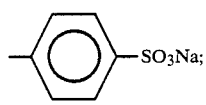

x is between 0.01 and 0.4;
the sum of x, y and z is 1.

5. The process according to claim 1 wherein said functionalized acrylic resin or copolymer is of Formula (II)

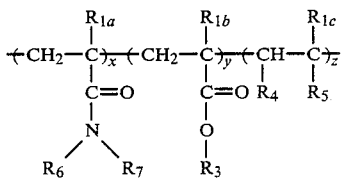

$R_{1a}$=H, —$CH_3$ or $R_2$ —COOH;
$R_{1b}$=H, —$CH_3$ or $R_2$ —COOH;
$R_{1c}$=H, —$CH_3$ or $R_2$ —COOH;
$R_2$ =alkyl;
$R_3$ =alkyl, aryl, alkaryl or hydrogen;
$R_4$ =H or —COOH;
$R_5$ =aryl, —CN,

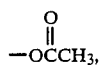

alkaryl, —$SO_3N_a$ or $SO_3N_a$;
$R_6$=H, —$CH_2OH$ or —$CH_2OR_2$; and
$R_7$=H, —$CH_2OH$ or —$CH_2OR_2$
x is between 0.01 and 0.4,
the sum of x, y and z is 1.

6. The process according to claim 1 wherein said formaldehyde condensate prepolymer is selected from the group consisting of melamine formaldehyde precondensate, urea formaldehyde precondensate, thiourea formaldehyde precondensate, aniline formaldehyde precondensate, cresol formaldehyde precondensate and xylenol formaldehyde precondensate.

7. The process according to claim 6 wherein said internal phase comprises an imaging composition including a material which undergoes a change in viscosity upon exposure to actinic radiation and an image-forming agent.

8. Microcapsules being produced by a process comprising the steps of a recording sheet comprising a support having a layer of microcapsules on the surface thereof said:
adding a water soluble hydroxy or amine functionalized acrylic resin or copolymer to an aqueous emulsion including a dispersed internal phase composition;
simultaneously or subsequently adding a formaldehyde condensate prepolymer to said emulsion; and
forming interpenetrating polymer network microcapsule walls around said internal phase, said interpenetrating polymer network microcapsule walls comprising the condensation reaction product of said functionalized acrylic resin or copolymer and said formaldehyde condensate prepolymer.

9. The recording sheet according to claim 8 further comprising isocyanate-derived walls which directly enwrap said internal phase.

10. The recording sheet according to claim 9 further comprising amine formaldehyde walls which directly enwrap said isocyanate-derived walls.

11. The recording sheet according to claim 8 wherein said functionalized acrylic resin or copolymer is of Formula I

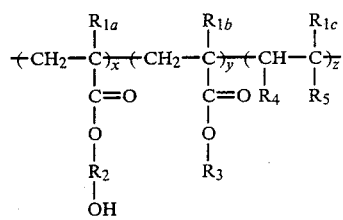

$R_{1a}$=H, —$CH_3$ or $R_2$—COOH;
$R_{1b}$=H, —$CH_3$ or $R_2$—COOH;
$R_{1c}$=H, —$CH_3$ or $R_2$—COOH;
$R_2$=alkylene;
$R_3$=alkyl, aryl, alkaryl or hydrogen;
$R_4$=H or —COOH;
$R_5$=aryl, —CN,

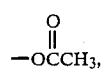

alkaryl, —$SO_3N_a$ or

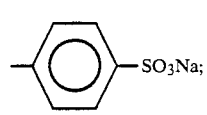

$R_6$=H, —$CH_2OH$ or —$CH_2OR_2$; and
$R_7$=H, —$CH_2OH$ or —$CH_2OR_2$
x is between 0.01 and 0.4,
the sum of x, y and z is 1.

12. The recording sheet according to claim 8 wherein said functionalized acrylic resin or copolymer is of Formula (II)

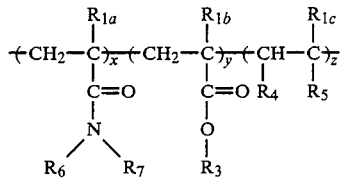

$R_{1a}$ = H, —$CH_3$ or $R_2$—COOH;

$R_{1b}$ = H, —$CH_3$ or $R_2$—COOH;

$R_{1c}$ = H, —$CH_3$ or $R_2$—COOH;

$R_3$ = alkyl, aryl, alkaryl or hydrogen;

$R_4$ = H or —COOH;

$R_5$ = aryl, —CN,

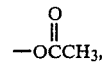

alkaryl, —$SO_3N_a$ or $SO_3N_a$;

$R_6$ = H, —$CH_2OH$ or —$CH_2OR_2$; and $R_7$ = H, —$CH_2OH$ or —$CH_2OR_2$ x is between 0.01 and 0.4; and the sum of x, y and z is 1.

13. The recording sheet according to claim 8 wherein said formaldehyde condensate prepolymer is selected from the group consisting of melamine formaldehyde precondensate, urea formaldehyde precondensate, thiourea formaldehyde precondensate, aniline formaldehyde precondensate, cresol formaldehyde precondensate and xylenol formaldehyde precondensate.

14. The recording sheet according to claim 13 wherein said internal phase comprises an imaging composition comprising a compound capable of undergoing a change in viscosity upon exposure to actinic radiation and an image-forming agent.

15. The recording sheet according to claim 8 wherein said recording material is a photosensitive recording material and said internal phase is a photohardenable composition.

* * * * *